United States Patent
Liu et al.

(10) Patent No.: US 9,123,699 B1
(45) Date of Patent: Sep. 1, 2015

(54) FORMATION OF PACKAGE PINS IN SEMICONDUCTOR PACKAGING

(75) Inventors: Chenglin Liu, San Jose, CA (US); Huahung Kao, San Jose, CA (US); Shiann-Ming Liou, Campbell, CA (US)

(73) Assignee: Marvell International Ltd., Hamilton (BM)

( * ) Notice: Subject to any disclaimer, the term of this patent is extended or adjusted under 35 U.S.C. 154(b) by 712 days.

(21) Appl. No.: 13/312,065

(22) Filed: Dec. 6, 2011

Related U.S. Application Data

(63) Continuation-in-part of application No. 13/277,556, filed on Oct. 20, 2011, now abandoned.

(60) Provisional application No. 61/405,443, filed on Oct. 21, 2010, provisional application No. 61/406,776, filed on Oct. 26, 2010, provisional application No. 61/421,771, filed on Dec. 10, 2010.

(51) Int. Cl.
| | |
|---|---|
| H01L 21/00 | (2006.01) |
| H01L 21/44 | (2006.01) |
| H01L 23/48 | (2006.01) |
| H01L 23/495 | (2006.01) |
| H01L 23/31 | (2006.01) |

(52) U.S. Cl.
CPC .............. *H01L 23/48* (2013.01); *H01L 23/495* (2013.01); *H01L 23/31* (2013.01)

(58) Field of Classification Search
USPC .................. 438/106, 108, 123, 615
See application file for complete search history.

(56) References Cited

U.S. PATENT DOCUMENTS

| | | | | |
|---|---|---|---|---|
| 5,528,078 | A * | 6/1996 | Shin .............................. | 257/676 |
| 6,707,152 | B1 * | 3/2004 | Schrock ....................... | 257/738 |
| 2002/0115293 | A1 * | 8/2002 | Ghodsian ..................... | 438/689 |

* cited by examiner

*Primary Examiner* — Khiem D Nguyen
*Assistant Examiner* — Wilner Jean Baptiste

(57) ABSTRACT

Embodiments provide a method of fabricating a semiconductor package, the method comprising forming a leadframe, wherein the leadframe includes an inner lead, and wherein a bottom surface of the inner lead comprises a first section and a second section; depositing an oxidation resistant material on the first section of the bottom surface of the inner lead; and forming an oxidation layer on the second section of the bottom surface of the inner lead, wherein the oxidation resistant material deposited on the first section of the bottom surface of the inner lead prevents the oxidation layer from forming on the first section of the bottom surface of the inner lead.

9 Claims, 9 Drawing Sheets

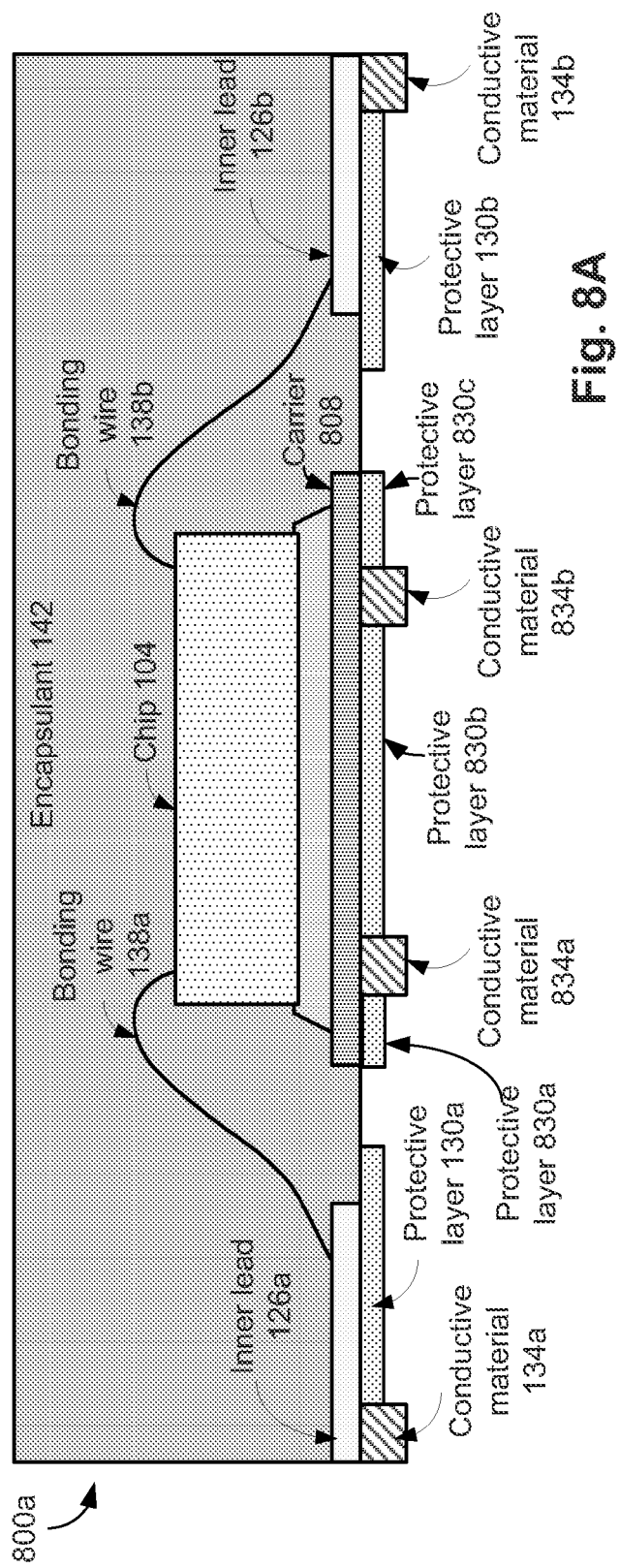

US 9,123,699 B1

FORMATION OF PACKAGE PINS IN SEMICONDUCTOR PACKAGING

CROSS-REFERENCES TO RELATED APPLICATIONS

The present disclosure claims priority to U.S. Provisional Patent Application No. 61/421,771 filed Dec. 10, 2010, the entire disclosure of which is hereby incorporated by reference in its entirety except for those sections, if any, that are inconsistent with this disclosure. The present disclosure is a continuation-in-part of U.S. patent application Ser. No. 13/277,556 filed Oct. 20, 2011, which claims priority to U.S. Provisional Patent Application No. 61/405,443 filed Oct. 21, 2010, and to U.S. Provisional Patent Application No. 61/406,776 filed Oct. 26, 2010, the entire disclosures of all of which are hereby incorporated by reference in their entireties except for those sections, if any, that are inconsistent with this disclosure.

TECHNICAL FIELD

Embodiments of the present disclosure relate to the field of semiconductor packaging, and more particularly, to formation of package pins in semiconductor packages.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

A semiconductor package is a casing—e.g., composed of metal, plastic, glass, ceramic, or other material—containing one or more semiconductor electronic components. A semiconductor package generally provides protection against impact and corrosion, and supports contact pins or leads which are used to connect a semiconductor electronic component within the semiconductor package to a circuit external to the semiconductor package. Examples of a semiconductor package include a Quad-Flat no-Leads (QFN) semiconductor package and a Quad Flat Package (QFP).

SUMMARY

In various embodiments, there is provided a method of fabricating a semiconductor package, the method comprising forming a leadframe, wherein the leadframe includes an inner lead, and wherein a bottom surface of the inner lead comprises a first section and a second section; depositing an oxidation resistant material on the first section of the bottom surface of the inner lead; and forming an oxidation layer on the second section of the bottom surface of the inner lead, wherein the oxidation resistant material deposited on the first section of the bottom surface of the inner lead prevents the oxidation layer from forming on the first section of the bottom surface of the inner lead.

In various embodiments, there is also provided a method of fabricating a semiconductor package, the method comprising forming an inner lead of a leadframe of the semiconductor package, a bottom surface of the inner lead comprising a first section and a second section; depositing a mask layer on the first section and the second section of the bottom surface of the inner lead; and depositing a conductive material on the first section of the bottom surface of the inner lead.

In various embodiments, there is also provided a method comprising forming an inner lead of a leadframe of a semiconductor package, a bottom surface of the inner lead comprising a first section and a second section; depositing a metal layer on the first section of the bottom surface of the inner lead; and attaching a mask layer on the second section of the bottom surface of the inner lead.

BRIEF DESCRIPTION OF THE DRAWINGS

Embodiments will be readily understood by the following detailed description in conjunction with the accompanying drawings. Embodiments are illustrated by way of example and not by way of limitation in the figures of the accompanying drawings.

FIGS. 8A and 8B illustrate cross-sectional views of various semiconductor packages, in accordance with various embodiments.

DETAILED DESCRIPTION OF DISCLOSED EMBODIMENTS

Figure 1:
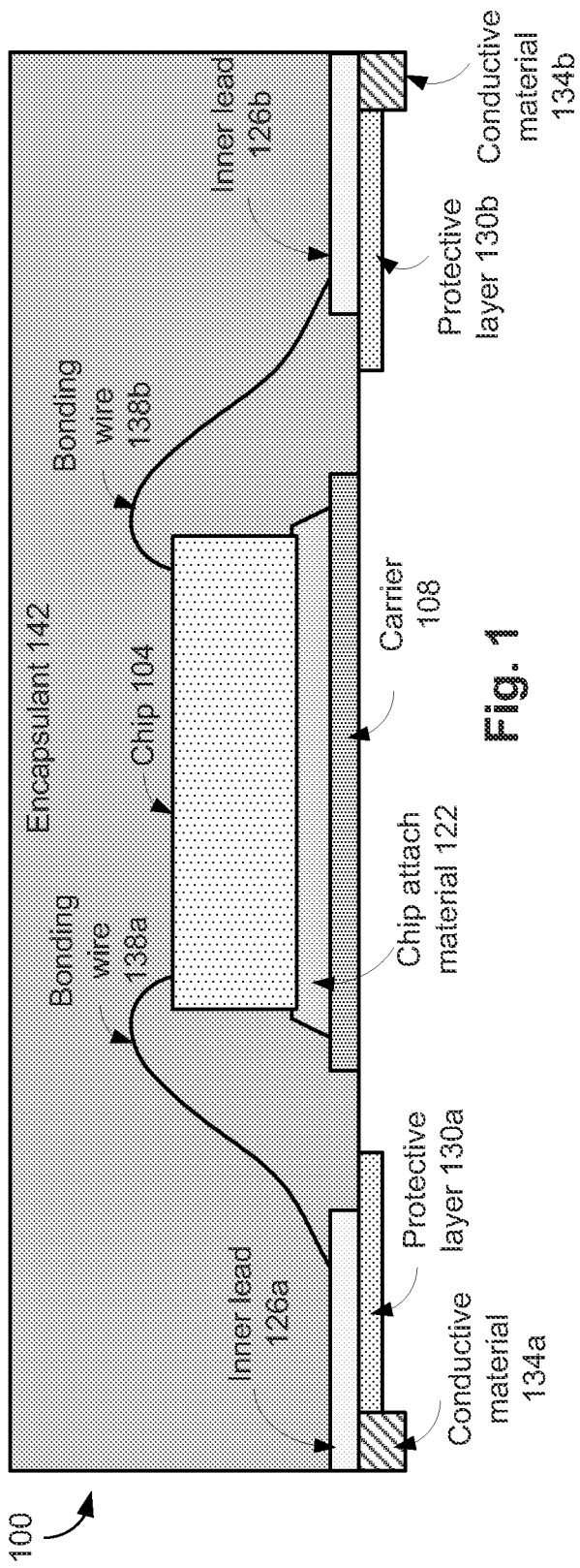
FIG. 1 illustrates a cross-sectional view of a semiconductor package, in accordance with various embodiments.

FIG. 1 illustrates a cross-sectional view of a semiconductor package 100, in accordance with various embodiments. The semiconductor package 100 includes a carrier 108, e.g., a circuit board, a substrate, or the like. The semiconductor package 100 also includes an integrated circuit chip 104 (referred to herein as "chip 104") disposed on the carrier 108. In an embodiment, a chip attach material 122 attaches the chip 104 to the carrier 108. The chip attach material 122 comprises, for example, polymer adhesives, silver paste, and/or the like.

The semiconductor package 100 includes a plurality of inner leads. For example, the cross-sectional view of the semiconductor package 100 illustrates two inner leads 126a, 126b. In an embodiment, the inner leads are a part of a leadframe (not separately labeled in FIG. 1) of the semiconductor package 100. In an embodiment, the carrier 108 is a part of the leadframe.

The inner leads are electrically coupled to the chip 104 through bonding wires. For example, the inner leads 126a, 126b are electrically coupled to the chip 104 through respective bonding wires 138a, 138b. An encapsulant 142 encapsulates the chip 104, the bonding wires 138a, 138b, and at least a portion of each of the inner leads, as illustrated in FIG. 1. In an embodiment, the encapsulant 142 does not fully encapsulate the inner leads. For example, the encapsulant 142 does not encapsulate at least a bottom surface of each of the inner leads 126a, 126b, as illustrated in FIG. 1.

In an embodiment, conductive materials are attached to a section of the bottom surface of each of the inner leads. For example, conductive materials 134a, 134b are attached to a section of the bottom surface of the inner leads 126a, 126b, respectively.

The conductive materials 134a, 134b are configured to attach the semiconductor package 100 to an external surface (e.g., a surface of a printed circuit board (PCB)), and electrically couple the respective inner leads 126a, 126b to a circuit external to the semiconductor package 100—e.g., an external circuit of the PCB. In an embodiment, the conductive materials 134a, 134b comprise pre-solder material (e.g., solder ball drop and/or solder paste). While mounting the semiconductor package 100 on the PCB, the conductive materials 134a, 134b are used for soldering the inner leads 126a, 126b to appropriate locations of the PCB. In another embodiment, the conductive materials 134a, 134b are packaging pins used to couple the inner leads 126a, 126b to appropriate locations of the PCB.

In an embodiment, protective layers are attached on at least a section of each of the inner leads. For example, protective layer 130a is attached on a section of the bottom surface of the inner lead 126a, and protective layer 130b is attached on a section of the bottom surface of the inner lead 126b. Thus, the protective layers 130a, 130b mask sections of the bottom surfaces of the respective inner leads 126a, 126b. Accordingly, a section of the bottom surface of, for example, the inner lead 126a is attached to the conductive material 134a and another section of the bottom surface of the lead 126a is attached to the protective layer 130a, such that not any section of the bottom surface of the inner lead 126a is exposed outside the semiconductor package 100.

The semiconductor package 100 has several advantages over conventional semiconductor packages. For example, the conductive materials 134a, 134b (which comprises, for example, pre-solder material) attached to the inner leads are used for soldering the inner leads to an external PCB. In an embodiment in which pre-solder material is attached to the inner leads during fabrication of the semiconductor package 100, the inner leads of the semiconductor package 100 can be relatively more reliably soldered to the PCB (e.g., compared to a conventional QFN semiconductor package). Furthermore, applying the protective layers 130a, 130b to the inner leads 134a, 134b prevent the conductive material 134a, 134b from spreading to other sections of the respective inner leads 126a, 126b during soldering of the conductive materials. This limits an area of the solder joint and results in an even more reliable solder joint of the inner lead with the PCB. Also, the inner leads of the semiconductor package 100 are relatively smaller than the inner leads of a QFP (e.g., as a QFP generally has large gull-wing leads). Accordingly, a package body size of the semiconductor package 100 is relatively smaller than that of a QFP. Furthermore, due to the relatively small inner lead size, a distance between the chip 104 and a ground terminal of the PCB may be relatively smaller in the semiconductor package 100 (e.g., compared to the QFP), thereby resulting in better grounding of the chip 104.

FIGS. 2A-2D illustrate various stages of fabrication of a section of the leadframe of the semiconductor package 100, in accordance with various embodiments. FIG. 3 illustrates an example of a corresponding method 300 for fabricating the section of the leadframe of the semiconductor package 100, in accordance with various embodiments. For example, FIGS. 2A-2D and 3 are directed towards fabrication of an inner lead 226 of the leadframe of the semiconductor package 100 of FIG. 1. The inner lead 226 may be, for example, similar to the inner lead 126a of FIG. 1. Although FIGS. 2A-2D and 3 illustrate fabrication of only one inner lead 226, in an embodiment, various other inner leads of the leadframe of the semiconductor package 100 may be fabricated in a similar manner.

Figure 2A:
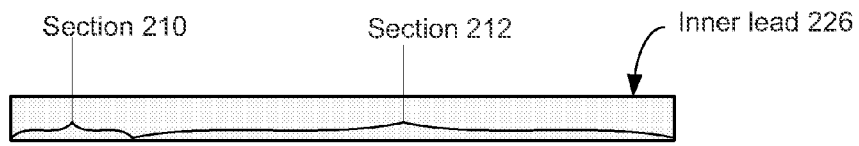
FIGS. 2A-2D, 4A-4C and 6A-6D illustrate various stages of fabrication of sections of leadframes of semiconductor packages, in accordance with various embodiments.
Figure 3:
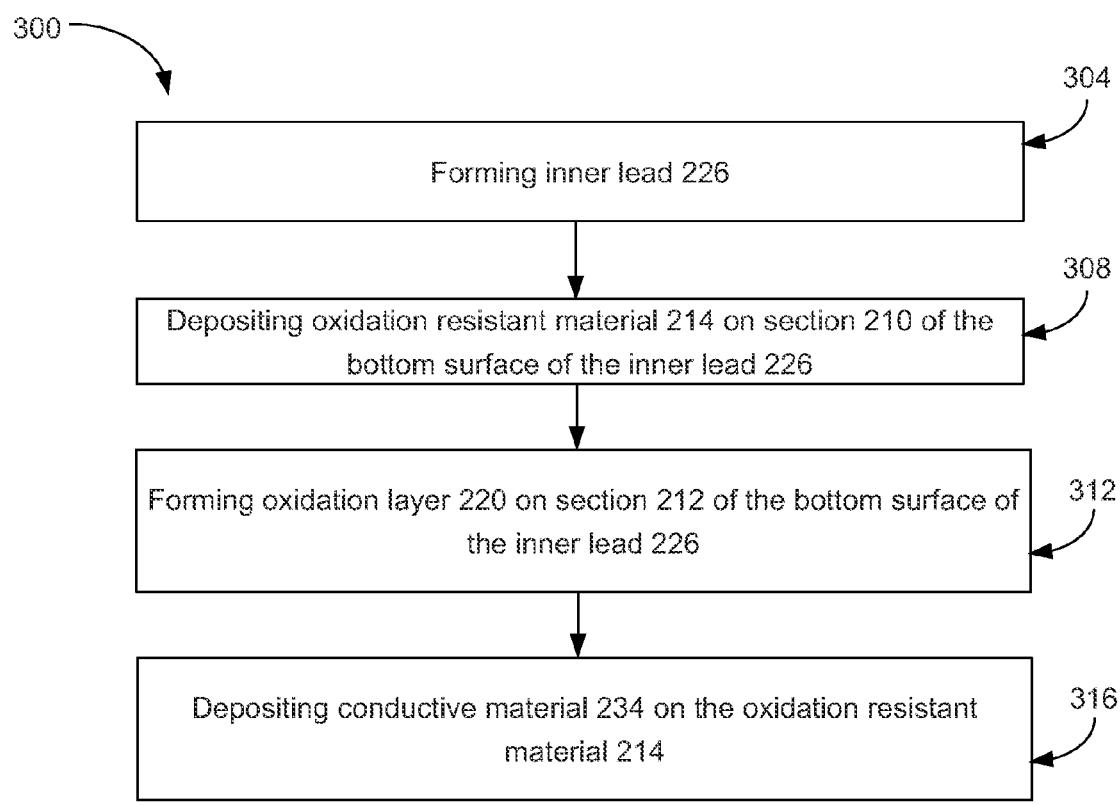
FIGS. 3, 5 and 7 illustrate example of methods for fabricating sections of leadframes of semiconductor packages, in accordance with various embodiments.

FIG. 2A illustrates the inner lead 226 of the lead frame of the semiconductor package 100 in more detail. Referring again to FIG. 3, at 304, the inner lead 226 is formed, as also illustrated in FIG. 2A. As further illustrated in FIG. 2A, the bottom surface of the inner lead 226 has a section 210 and a section 212.

Figure 2B:
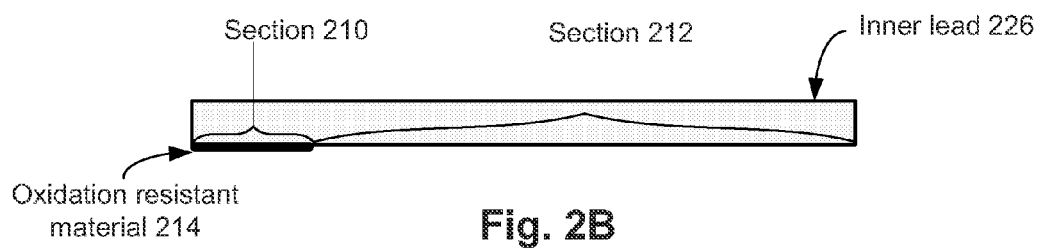

Referring again to FIG. 3, at 308, an oxidation resistant material 214 is deposited on section 210 of the bottom surface of the inner lead 226, as also illustrated in FIG. 2B. In an embodiment, the oxidation resistant material 214 comprises a metal alloy comprising one or more of nickel, palladium and gold. In an embodiment, the inner lead 226 comprises copper. As discussed in more detail herein later, the oxidation resistant material 214 has relatively higher oxidation resistance properties (e.g., compared to copper). For example, if copper and the oxidation resistant material 214 are exposed to an environment (e.g., high temperature, application of chemicals that expedites oxidation, etc.) that aids in oxidation, an exposed surface of the copper oxidizes relatively more compared to that of the oxidation resistant material 214.

The oxidation resistant material 214 is selectively deposited on the section 210 (and not on the section 212) in any suitable manner. As an example, a photo-resist film (or any other appropriate material) is deposited to cover substantially the entire bottom portion of the inner lead 226 of FIG. 2A. The photo-resist film is then selectively etched to expose the section 210 of the bottom portion of the inner lead 226. The oxidation resistant material 214 is selectively deposited on the section 210 through the etched photo-resist film. The oxidation resistant material 214 is not deposited on the section 212, as the section 212 is covered by the photo-resist film. Subsequently, the photo-resist film is etched from the section 212, to form the structure of FIG. 2B in which the oxidation resistant material 214 is deposited on the section 210 (but not on section 212).

Figure 2C:
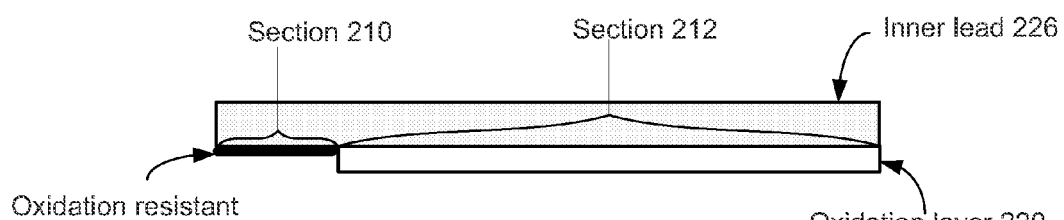

Referring again to FIG. 3, at 312, an oxidation layer 220 is formed on section 212 of the bottom surface of the inner lead 226, as also illustrated in FIG. 2C. For example, the inner lead 226 is exposed to an environment that aids in oxidation (referred to herein as an oxidation aiding environment). For example, the inner lead 226 is exposed 214 to high temperature for a prolonged period, chemicals that aid in the oxidation process are applied on or in the vicinity of the inner lead 126, and/or the like. As previously discussed, the inner lead 226 may comprise copper, and copper oxidizes relatively more compared to the oxidation resistant material 214 in the oxidation aiding environment. In an embodiment, the oxidation resistant material 214 comprises material that refrains from being substantially oxidized in the oxidation aiding environment. The oxidation layer 220 is formed on the section 212 in the oxidation aiding environment (but no such oxidation layer is formed on the oxidation resistant material 214). In an embodiment, the oxidation layer 220 has poor electrical conductive properties, and acts as an insulator. In an embodiment, the oxidation layer 220 forms a protective layer (e.g., similar to the protective layer 130a of FIG. 1) on section 212 of the inner lead 226.

Figure 2D:
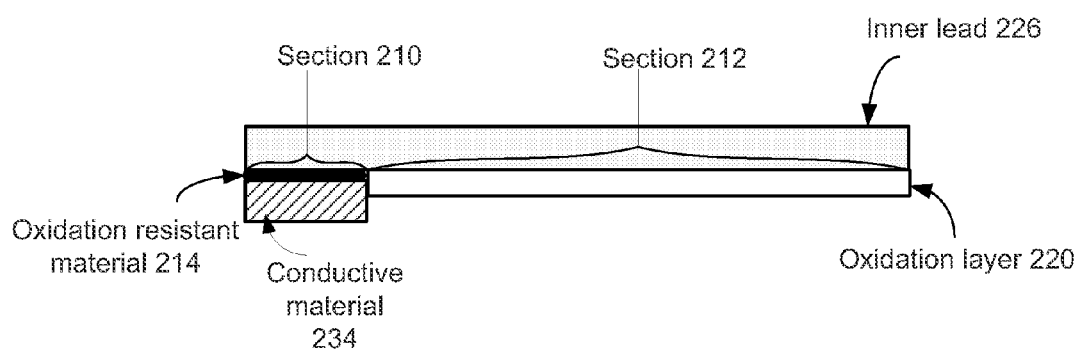

Referring again to FIG. 3, at 316, a conductive material 234 (e.g., which may be similar to the conductive material 134a of FIG. 1) is deposited on the oxidation resistant material 214, as also illustrated in FIG. 2D. In an embodiment, the conductive material 234 comprises a pre-solder material (e.g., solder ball drop and/or solder paste), and the conductive material 234 can be deposited on the oxidation resistant material 214 using any appropriate method (e.g., soldering the conductive material 234 to the oxidation resistant material 214, or the like).

One or more of the various stages of formation of the inner lead 226 of the leadframe of the semiconductor package 100 (e.g., as illustrated in FIGS. 2A-2D) and the corresponding method 300 is performed, for example, while fabricating the leadframe. Although not illustrated in FIGS. 2A-2D and 3, once the conductive material 234 and the oxidation layer 220 are deposited on the inner lead 226 (and similar operations are performed on one or more other inner leads of the leadframe), a chip (e.g., chip 104) is disposed on a carrier (e.g., carrier 108 of the leadframe), the inner lead 226 is coupled via a bonding wire (e.g., similar to the bonding wire 138a) to the chip 104, and an encapsulant (e.g., encapsulant 142) is used to encapsulate the chip 104 to form the semiconductor package 100 of FIG. 1.

Figure 4A:
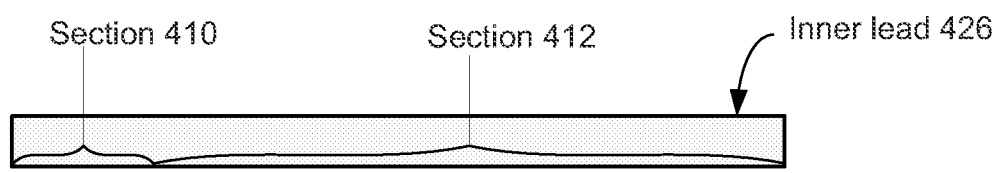
Figure 4B:
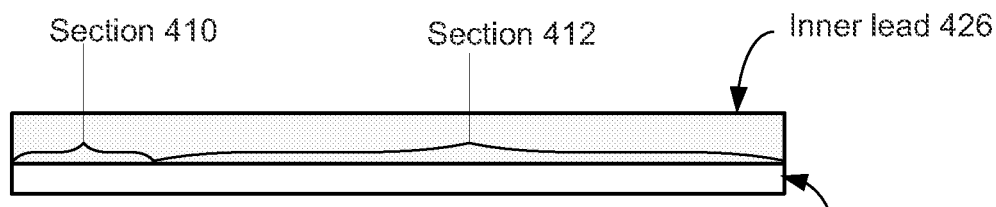
Figure 4C:
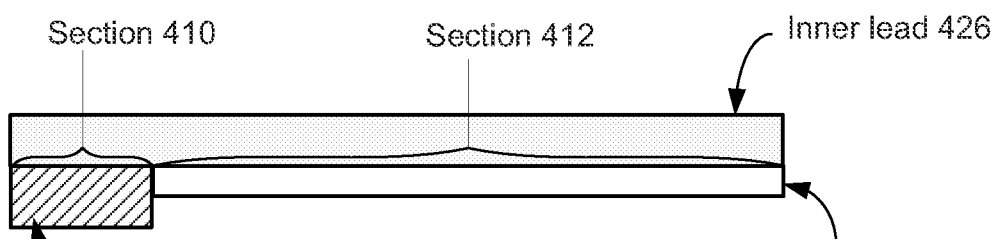
Figure 5:
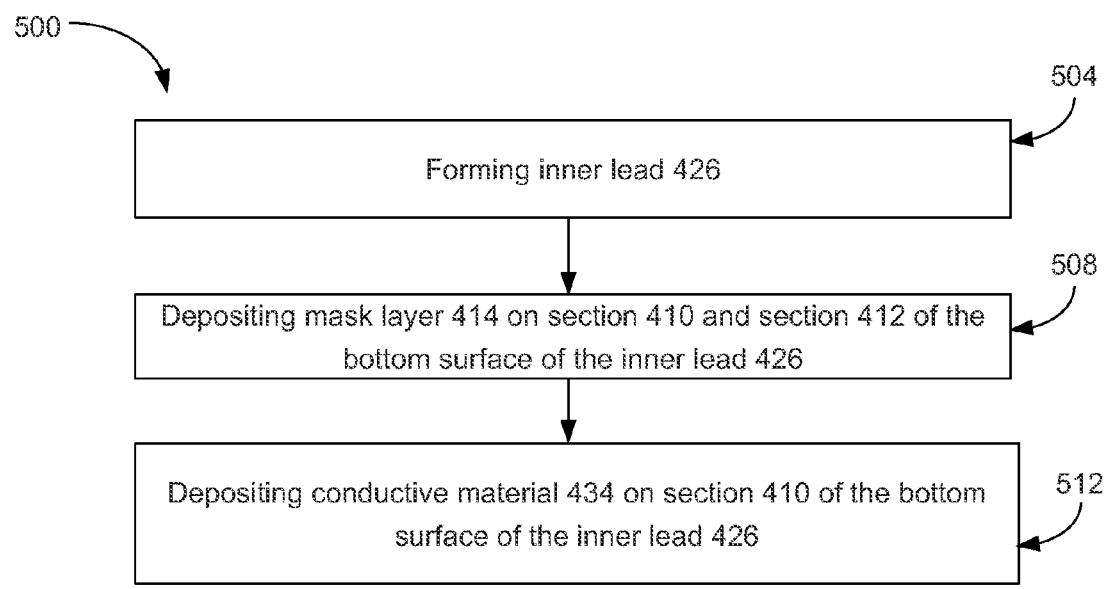

FIGS. 4A-4C illustrate various stages of fabrication of a section of the leadframe of the semiconductor package 100, in accordance with various embodiments. FIG. 5 illustrates an example of a corresponding method 500 for fabricating the section of the leadframe of the semiconductor package 100, in accordance with various embodiments. For example, FIGS. 4A-4C and 5 are directed towards fabrication of an inner lead 426 of the leadframe of the semiconductor package 100 of FIG. 1. The inner lead 426 may be, for example, similar to the inner lead 126a of FIG. 1. Although FIGS. 4A-4C and 5 illustrate fabrication of only one inner lead 426, various other inner leads of the leadframe of the semiconductor package 100 may be fabricated in a similar manner.

FIG. 4A illustrates the inner lead 426 of the lead frame of the semiconductor package 100 in more detail. Referring again to FIG. 5, at 504, the inner lead 426 is formed, as also illustrated in FIG. 4A. As further illustrated in FIG. 4A, the bottom surface of the inner lead 126a has a section 410 and a section 412.

Referring again to FIG. 5, at 508, a mask layer 414 is deposited on section 410 and section 412 of the bottom surface of the inner lead 426, as also illustrated in FIG. 4B. In an embodiment, the mask layer 414 comprises organic material, e.g., an appropriate organic surface preservative (OSP). In an embodiment, the mask layer 414 comprises material that can be cleaned by flux while applying solder material over the mask layer 414.

Referring again to FIG. 5, at 512, a conductive material 434 is deposited on section 410 of the bottom surface of the inner lead 426, as also illustrated in FIG. 4C. In an embodiment, the conductive material 434 is at least in part similar to the conductive material 134a of FIG. 1. In an embodiment, the conductive material 434 comprises a pre-solder material (e.g., solder ball drop and/or solder paste) and includes flux material. In an embodiment, while depositing (e.g., by soldering) the conductive material 434, the flux material included in the conductive material 434 cleans the mask layer 414 that was previously deposited on the section 410. Accordingly, the conductive material 434 attaches to the section 410, thereby being electrically coupled to the inner lead 426.

In an embodiment, the mask layer 414 has poor electrical conductive properties, and acts as an insulator. In an embodiment, the mask layer 414 forms a protective layer (e.g., similar to the protective layer 130a of FIG. 1) on section 412 of the inner lead 426.

One or more of the various stages of formation of the inner lead 426 of the leadframe of the semiconductor package 100 (e.g., as illustrated in FIGS. 4A-4C) and the corresponding method 500 is performed, for example, while fabricating the leadframe. Although not illustrated in FIGS. 4A-4C and 5, once the conductive material 434 and the mask layer 414 are deposited on the inner lead 426 (and similar operations are performed on one or more other inner leads of the leadframe), a chip (e.g., chip 104) is disposed on a carrier (e.g., carrier 108 of the leadframe), the inner lead 126a chip 104 is coupled via a bonding wire (e.g., bonding wire 138a) to the chip 104, and an encapsulant (e.g., encapsulant 142) is used to encapsulate the chip 104 to form the semiconductor package 100 of FIG. 1.

FIGS. 6A-6D illustrate various stages of fabrication of a section of the leadframe of the semiconductor package 100, in accordance with various embodiments. FIG. 7 illustrates an example of a corresponding method 700 for fabricating the section of the leadframe of the semiconductor package 100, in accordance with various embodiments. For example, FIGS. 6A-6D and 7 are directed towards fabrication of an inner lead 626 of the leadframe of the semiconductor package 100 of FIG. 1. The inner lead 626 may be, for example, similar to the inner lead 126a of FIG. 1. Although FIGS. 6A-6D and 7 illustrate fabrication of only one inner lead 626, various other inner leads of the leadframe of the semiconductor package 100 may be fabricated in a similar manner.

Figure 6A:
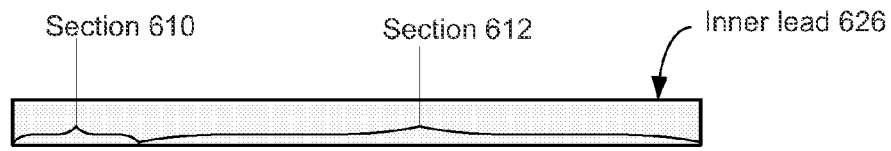
Figure 7:
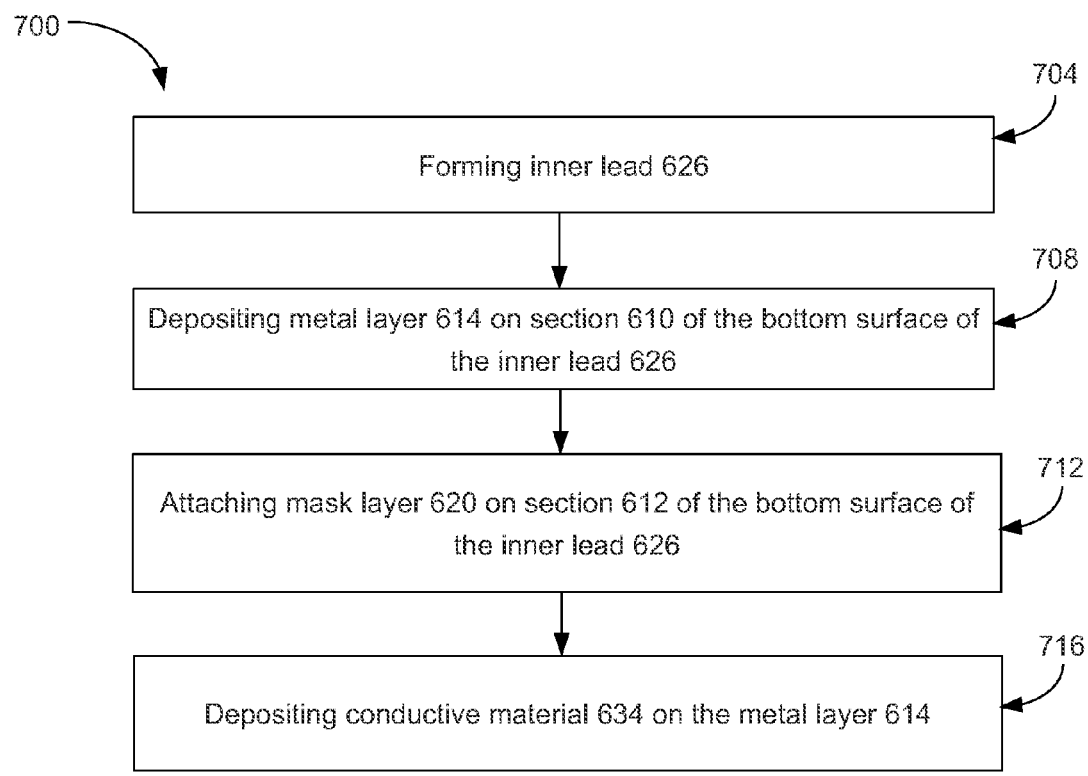

FIG. 6A illustrates the inner lead 626 of the lead frame of the semiconductor package 100 in more detail. Referring again to FIG. 7, at 704, the inner lead 626 is formed, as also illustrated in FIG. 6A. As further illustrated in FIG. 6A, the bottom surface of the inner lead 626 has a section 610 and a section 612.

Figure 6B:
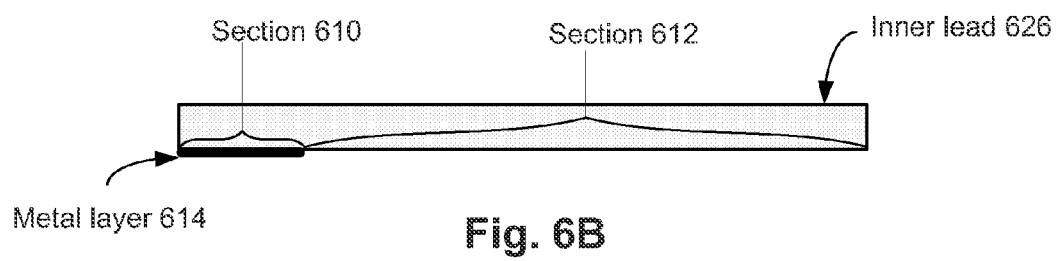

Referring again to FIG. 7, at 708, a metal layer 614 is deposited on section 610 of the bottom surface of the inner lead 626, as also illustrated in FIG. 6B. In an embodiment, the metal layer 614 comprises a metal alloy comprising one or more of nickel, palladium and gold.

The metal layer 614 is selectively deposited on the section 610 (and not on the section 612) in any suitable manner. For example, a photo-resist film (or any other appropriate material) is deposited to cover substantially the entire bottom portion of the inner lead 626 of FIG. 6A. The photo-resist film is then selectively etched to expose the section 610 of the bottom portion of the inner lead 626. The metal layer 614 is then selectively deposited on the section 610 through the etched photo-resist film. The metal layer 614 is not deposited on the section 612, as the section 612 is covered by the photo-resist film. Subsequently, the photo-resist film is etched from the section 612, to form the structure of FIG. 6B in which the metal layer 614 is deposited on the section 610 (but not on section 612).

Figure 6C:
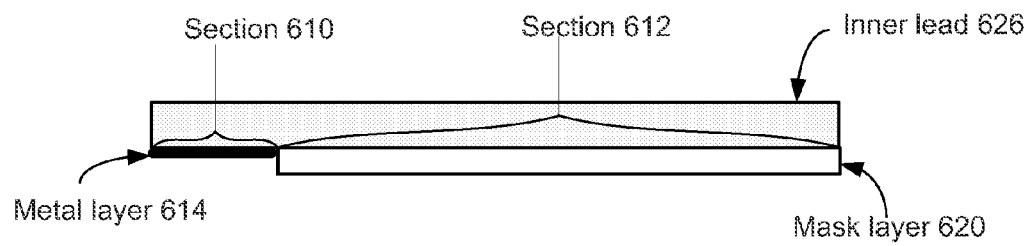
Figure 6D:
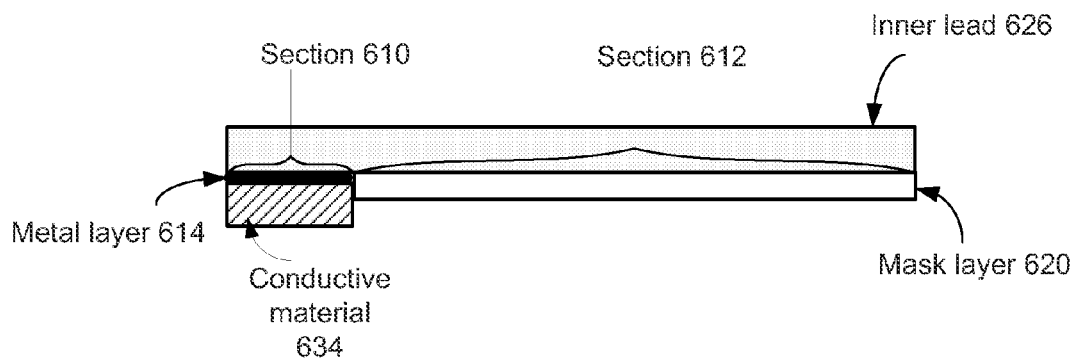

Referring again to FIG. 7, at 712, a mask layer 620 is attached on section 612 of the bottom surface of the inner lead 626, as also illustrated in FIG. 6C. In an embodiment, the mask layer 620 is not attached to the metal layer 614.

The mask layer 620 is selectively attached to the section 612 (but not to the metal layer 614) by an appropriate manner. For example, the inner lead 626 comprises a first material (e.g., copper), and the metal layer 614 comprises a second material (e.g., an appropriate metal alloy). In an embodiment, the mask layer 620 comprises a third material (e.g., an appropriate organic material) that selectively adheres to the first material, but does not adhere to the second material. Accordingly, when the mask layer is applied to the bottom surface of the inner lead 626, the material of the mask layer selectively adheres to the section 612 of the bottom surface of the inner lead 626, thereby forming the mask layer 620 of FIG. 6C. However, the material of the mask layer 620 does not adhere to the metal layer 614, and accordingly, no mask layer is formed on the metal layer 614.

In an embodiment, the mask layer 620 has poor electrical conductive properties, and acts as an insulator. In an embodiment, the mask layer 620 forms a protective layer (e.g., similar to the protective layer 130a of FIG. 1) on section 612 of the inner lead 626.

Referring again to FIG. 7, at 716, a conductive material 634 (e.g., which may be similar to the conductive material 134a of FIG. 1) is deposited on the metal layer 614, as also illustrated in FIG. 7d. In an embodiment, the conductive material 634 comprises a pre-solder material (e.g., solder ball drop and/or solder paste), and the conductive material 634 is deposited on the metal layer 614 using any appropriate method (e.g., soldering the conductive material 634 to the metal layer 614, or the like).

One or more of the various stages of formation of the inner lead 626 of the leadframe of the semiconductor package 100 (e.g., as illustrated in FIGS. 6A-6D) and the corresponding method 700 is performed, for example, while fabricating the leadframe. Although not illustrated in FIGS. 6A-6D and 7, once the conductive material 634 and the mask layer 620 are deposited on the inner lead 626 (and similar operations are performed on one or more other inner leads of the leadframe), a chip (e.g., chip 104) is disposed on a carrier (e.g., carrier 108 of the leadframe), the inner lead 226 chip 104 is coupled via a bonding wire (e.g., similar to the bonding wire 138a) to the chip 104, and an encapsulant (e.g., encapsulant 142) is used to encapsulate the chip 104 to form the semiconductor package 100 of FIG. 1.

FIG. 8A illustrates a cross-sectional view of a semiconductor package 800a, in accordance with various embodiments. The semiconductor package 800a is similar to the semiconductor package 100 of FIG. 1. However, unlike the semiconductor package 100, in the semiconductor package 800a, conductive materials 834a, 834b are deposited on various sections of the bottom surface of a carrier 808. Furthermore, in the semiconductor package 800a, protective layers 830a, 830b, 830c are deposited on various other sections of the bottom surface of the carrier 808. The conductive materials and the protective layers, which are deposited on the bottom surface of the carrier 808 of the semiconductor package 800a, may be formed in a manner similar to that discussed with respect to methods 300, 500 and/or 700 of FIGS. 3, 5 and/or 7, respectively.

Figure 8B:
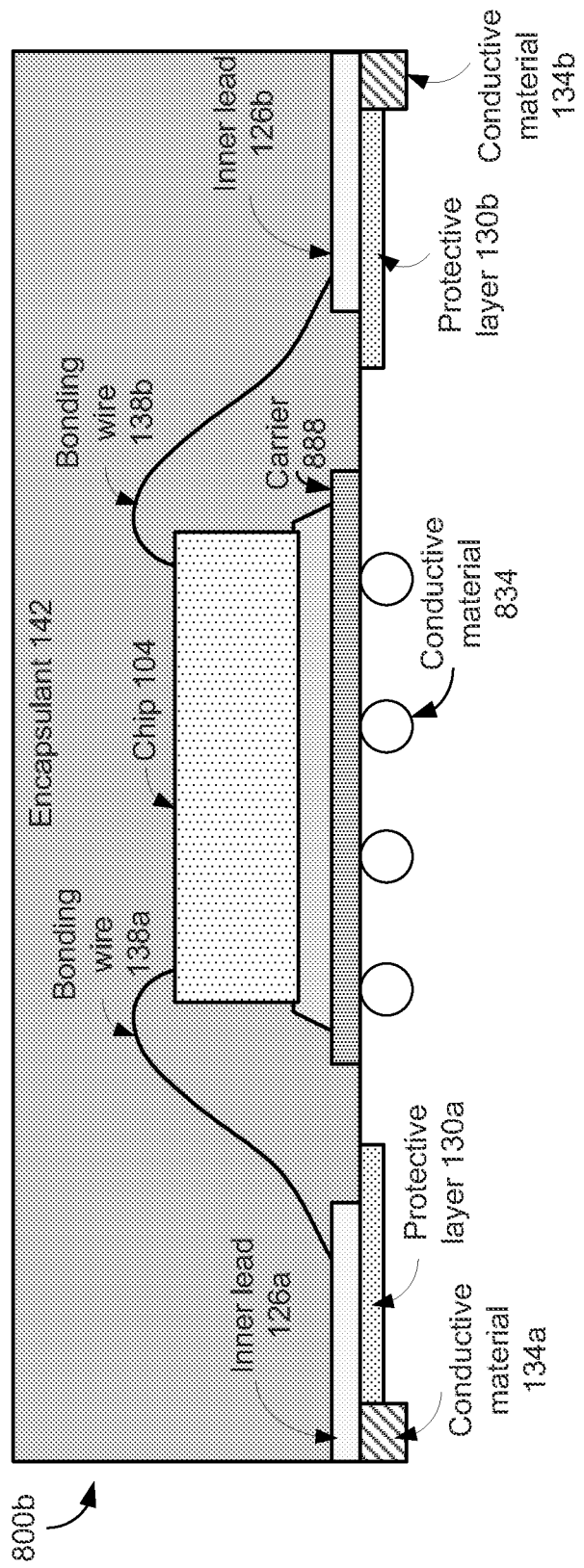

FIG. 8B illustrates a cross-sectional view of a semiconductor package 800b, in accordance with various embodiments. The semiconductor package 800b is similar to the semiconductor package 100 of FIG. 1. However, unlike the semiconductor package 100, in the semiconductor package 800b, a plurality of conductive materials 834 are deposited on the bottom surface of a carrier 888, e.g., in a form of a ball grid. The plurality of conductive materials 834 comprises, for example, solder balls.

Various operations may have been described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

The description may use the terms "embodiment" or "embodiments," which may each refer to one or more of the same or different embodiments. Furthermore, the terms "comprising," "including," "having," and the like, as used with respect to embodiments, are synonymous.

Although certain embodiments have been illustrated and described herein, a wide variety of alternate and/or equivalent embodiments or implementations calculated to achieve the same purposes may be substituted for the embodiments shown and described without departing from the scope. This application is intended to cover any adaptations or variations of the embodiments discussed herein. Therefore, it is manifestly intended that embodiments be limited only by the claims and the equivalents thereof.

What is claimed is:

1. A method of fabricating a semiconductor package, the method comprising:
   forming a leadframe, wherein the leadframe includes an inner lead, and wherein a bottom surface of the inner lead comprises a first section and a second section;
   depositing an oxidation resistant material on the first section of the bottom surface of the inner lead; and
   subsequent to depositing the oxidation resistant material on the first section of the bottom surface of the inner lead, forming an oxidation layer on the second section of the bottom surface of the inner lead, wherein the oxidation resistant material deposited on the first section of the bottom surface of the inner lead prevents the oxidation layer from forming on the first section of the bottom surface of the inner lead,
   wherein depositing the oxidation resistant material on the first section of the bottom surface of the inner lead comprises
      applying a masking layer on the bottom surface of the inner lead,
      selectively etching the masking layer to expose the first section of the bottom surface of the inner lead,
      depositing the oxidation resistant material, through the etched masking layer, on the first section of the bottom surface of the inner lead, and
      removing the masking layer from the second section of the bottom surface of the inner lead.

2. The method of claim 1, further comprising:
   depositing a conductive material on the oxidation resistant material, the conductive material to (i) attach the semiconductor package to a surface external to the semiconductor package, and (ii) electrically couple the inner lead to a circuit external to the semiconductor package.

3. The method of claim 1, wherein the oxidation resistant material comprises a metal alloy comprising one or more of nickel, palladium and gold.

4. The method of claim 1, wherein the inner lead comprises copper.

5. The method of claim 1, wherein:
   forming the oxidation layer further comprises oxidizing the inner lead;
   the inner lead comprises a first material that oxidizes to form the oxidation layer; and
   the oxidation resistant material comprises a second material that refrains from being substantially oxidized during oxidizing the inner lead.

6. The method of claim 5, wherein oxidizing the inner lead further comprises:
   oxidizing the inner lead by performing one or both of (i) exposing the inner lead to high temperature over a period of time, and (ii) applying oxidation chemicals on the inner lead.

7. The method of claim 1, wherein the first section and the second section substantially completely cover the bottom surface of the inner lead.

8. The method of claim 1, further comprising:
   disposing an integrated circuit chip on a carrier of the leadframe; and
   coupling, via a bonding wire, the integrated circuit chip to the inner lead.

9. The method of claim 8, further comprising:
   encapsulating the integrated circuit chip with an encapsulant.

* * * * *